United States Patent
Pei et al.

(10) Patent No.: US 6,333,850 B1
(45) Date of Patent: Dec. 25, 2001

(54) HEAT SINK SYSTEM

(75) Inventors: Hsien-Shen Pei, Tu-Chen; Chung-Yung Sun, Kee-Lung; Chao-Yang Lee, Taipei, all of (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/364,322

(22) Filed: Jul. 29, 1999

(30) Foreign Application Priority Data

Feb. 5, 1999 (TW) .................................. 88201931

(51) Int. Cl.⁷ ...................................................... H05K 7/20
(52) U.S. Cl. ........................... 361/695; 174/15.2; 361/700
(58) Field of Search ....................... 165/104.33; 174/15.2; 361/687, 694–695, 700

(56) References Cited

U.S. PATENT DOCUMENTS 6,043,980 * 3/2000 Katsui ................................... 361/695
6,111,748 * 8/2000 Bhatia ................................... 361/695

* cited by examiner

*Primary Examiner*—Gregory Thompson
(74) *Attorney, Agent, or Firm*—Wei Te Chung

(57) ABSTRACT

A heat sink system assembled within a computer enclosure for dissipating heat away from a heat generating element comprises a fan duct, a heat pipe and a fan. The computer enclosure forms an opening. The fan duct is a square hollow shell attached to the computer enclosure, with a surface thereof coupled to the computer enclosure near the opening. A first hole is defined in the surface of the fan duct in communication with the opening, thereby communicating with an exterior of the computer enclosure. A second hole is defined in another surface of the fan duct in communication with an interior of the computer enclosure. The heat pipe includes a main body and two attaching portions at opposite ends thereof for being respectively attached to the heat generating element and the fan duct. The main body has a conductive material disposed therein. The fan is assembled within the first hole.

4 Claims, 3 Drawing Sheets

HEAT SINK SYSTEM

BACKGROUND OF THE INVENTION

1. Field of the Invention

The present invention relates to a heat sink system, and particularly to a heat sink system having a fan.

2. Description of Prior Art

As computer technology continues to advance, central processing units and chipsets in computers have faster operational speeds and larger functional capabilities. Heat produced within a computer enclosure increases greatly due to the increase in the operational speed. It is desirable to dissipate the heat quickly, for example using a heat sink system assembled within the computer enclosure, so that the computer chips operate in their normal temperature range. This will assure the quality of data operation, storage and transfer.

A conventional heat sink system includes a heat sink and a fan mounted on the chip. The heat produced by the chip is first transferred to the heat sink attached to the chip, and is then dissipated by the fan mounted on the heat sink. As chips get faster and produce more heat, the size of the heat sink must be correspondingly increased. However, increasing the size of the heat sink is not in line with the trend toward miniaturization in the computer industry. Furthermore, the surface area of a heat sink is limited by practical consideration in manufacturing technology.

SUMMARY OF THE INVENTION

Accordingly, an object of the present invention is to provide a heat sink system for dissipating heat away from a heat generating element.

In a preferred embodiment of the present invention, a heat sink system, assembled within a computer enclosure for introducing ambient air though an opening of the computer enclosure to dissipate heat away from a heat generating element, comprises a fan duct, a heat pipe and a fan. The fan duct has a surface coupled to the computer enclosure near the opening. The fan duct defines a first hole in communication with the opening and a second hole substantially within an interior of the computer enclosure. The heat pipe is attached and connected between the heat generating element and the fan duct. The fan is assembled within the first hole of the fan duct.

BRIEF DESCRIPTION OF THE DRAWINGS

Other objects and advantages of the present invention will be understood from the following description of a heat sink system according to preferred embodiments of the present invention shown in the accompanying drawings, in which.

DETAILED DESCRIPTION OF THE PREFERRED EMBODIMENTS

Figure 1:
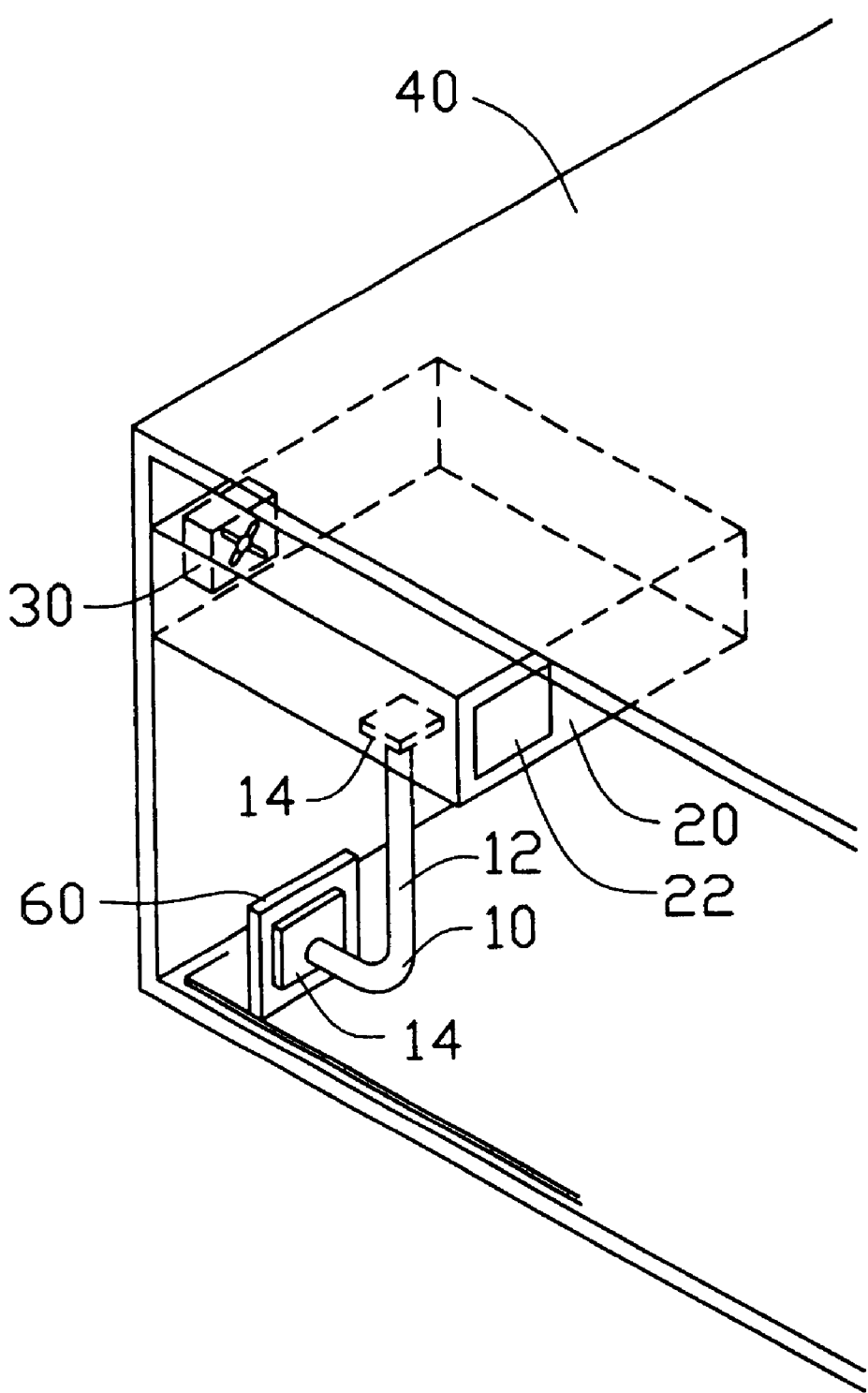
FIG. 1 is a perspective view of a heat sink system embodying the concepts of the present invention in accordance with a first embodiment.

For facilitating understanding, like components are designated by like reference numerals throughout the various embodiments shown in the attached drawing figures.

FIG. 1 shows a heat sink system of the present invention comprising a heat pipe 10, a fan duct 20 and a fan 30. The fan duct 20 is a square hollow metallic shell attached to a computer enclosure 40 forming an opening (not shown). A surface of the fan duct 20 coupled to the computer enclosure 40 defines a first hole (not shown) in communication with the opening thereby communicating with an exterior of the computer enclosure 40. A second hole 22 is defined in a surface opposite the first hole in communication with an interior of the computer enclosure 40. The fan 30 is assembled within the first hole for aspirating cold air from the exterior into the fan duct 20. The heat pipe 10 includes a main body 12 and two attaching portions 14 at opposite ends thereof. The two attaching portions 14 are attached to a heat generating element (such as a chip) and the fan duct 20, respectively. Liquid being in a liquid state at a nonoperating temperature, such as water, is disposed within the main body 12.

Thus, heat can be conducted away from a heat generating element 60 toward the fan duct 20 due to convection of the liquid and due to the liquid changing to a gaseous state. Cold air is aspirated from the exterior through the first hole and the fan duct 20 and out of the second hole 22 whereby heat accumulating in the fan duct 20 is dissipated. Since the heat pipe 10 has good conductibility, the fan duct 20 has a large surface area and the fan 30 aspirates cold air for quickening convection, the heat sink system of the present invention provides beneficial heat dissipation qualities.

Figure 2:
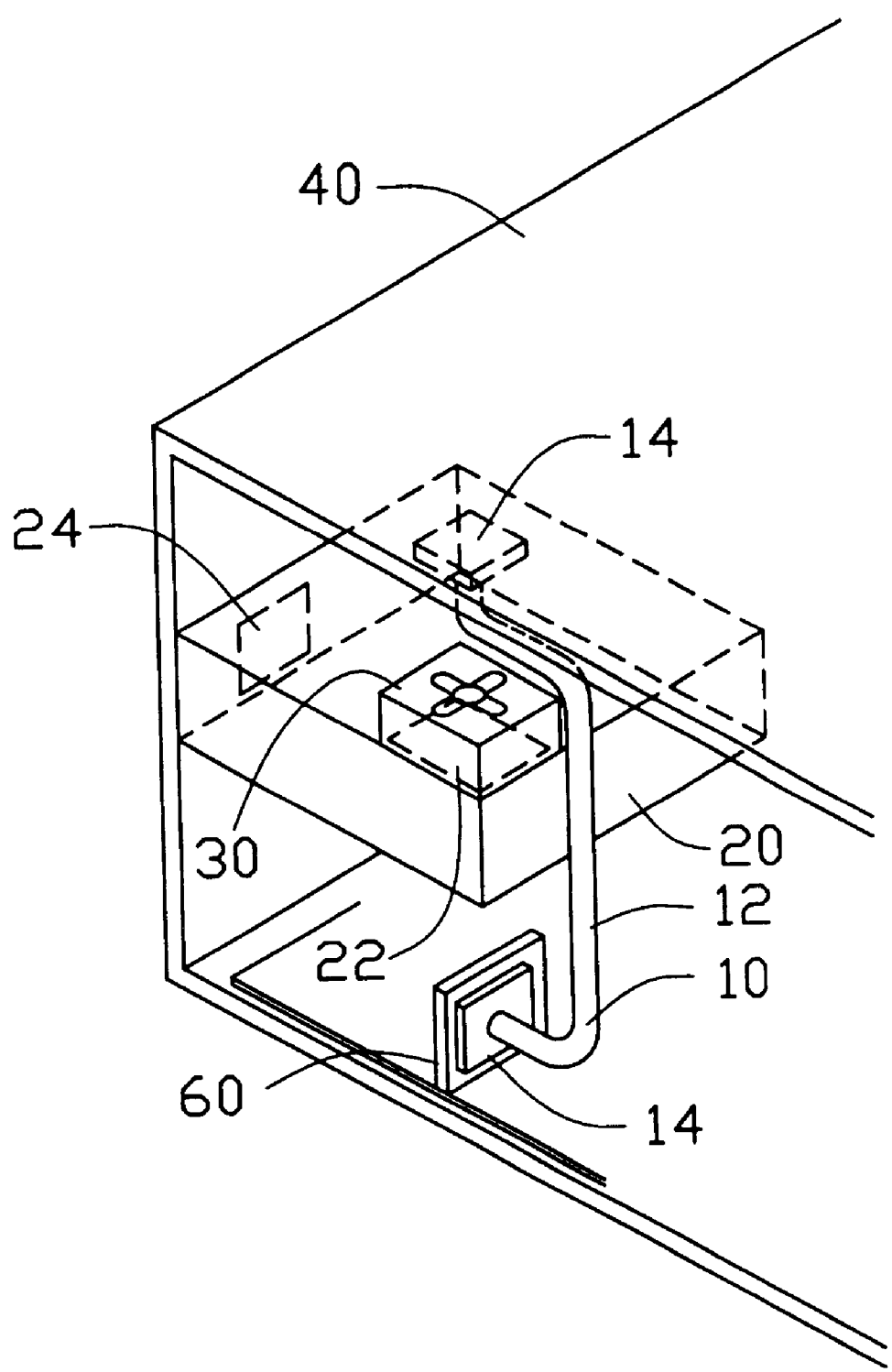
FIG. 2 is a perspective view of a second embodiment of a heat sink system.

Referring to FIG. 2, the heat sink system of a second embodiment of the present invention includes a heat pipe 10, a fan duct 20, a fan 30 and a computer enclosure 40. The fan duct 20 is a square hollow plastic shell having a side surface attached to the computer enclosure 40 having an opening (not shown). The side surface of the fan duct 20 defines a first hole 24 in communication with the opening thereby communicating with an exterior of the computer enclosure 40. A second hole 22 is defined in a top surface of the fan duct 20 in communication with an interior of the computer enclosure 40. The fan 30 is attached to the top surface of the fan duct 20 and engages with the second hole 22 for aspirating cold air from the exterior through the fan duct 20 to the interior. The heat pipe 10 includes a main body 12 and two attaching portions 14 at both ends thereof. The two attaching portions 14 are attached to a heat generating element 60 (such as a chipset) and the computer enclosure 40 at a position proximate the fan 30, respectively. Liquid being in a liquid state at a nonoperating temperature, such as water, is disposed within the main body 12.

Thus, heat can be conducted away from the heat generating element 60 toward the computer enclosure 40 due to convection of the liquid and the liquid changing to a gaseous state. The cold air is aspirated from the first hole 24 through the fan duct 20 and out of the second hole 22. The cold air then exits the fan 30 and directly strikes the computer enclosure 40 whereby heat accumulating on the computer enclosure 40 is dissipated. Furthermore, the computer enclosure 40 having a large surface area promotes quick dissipation of heat to the exterior.

Figure 3:
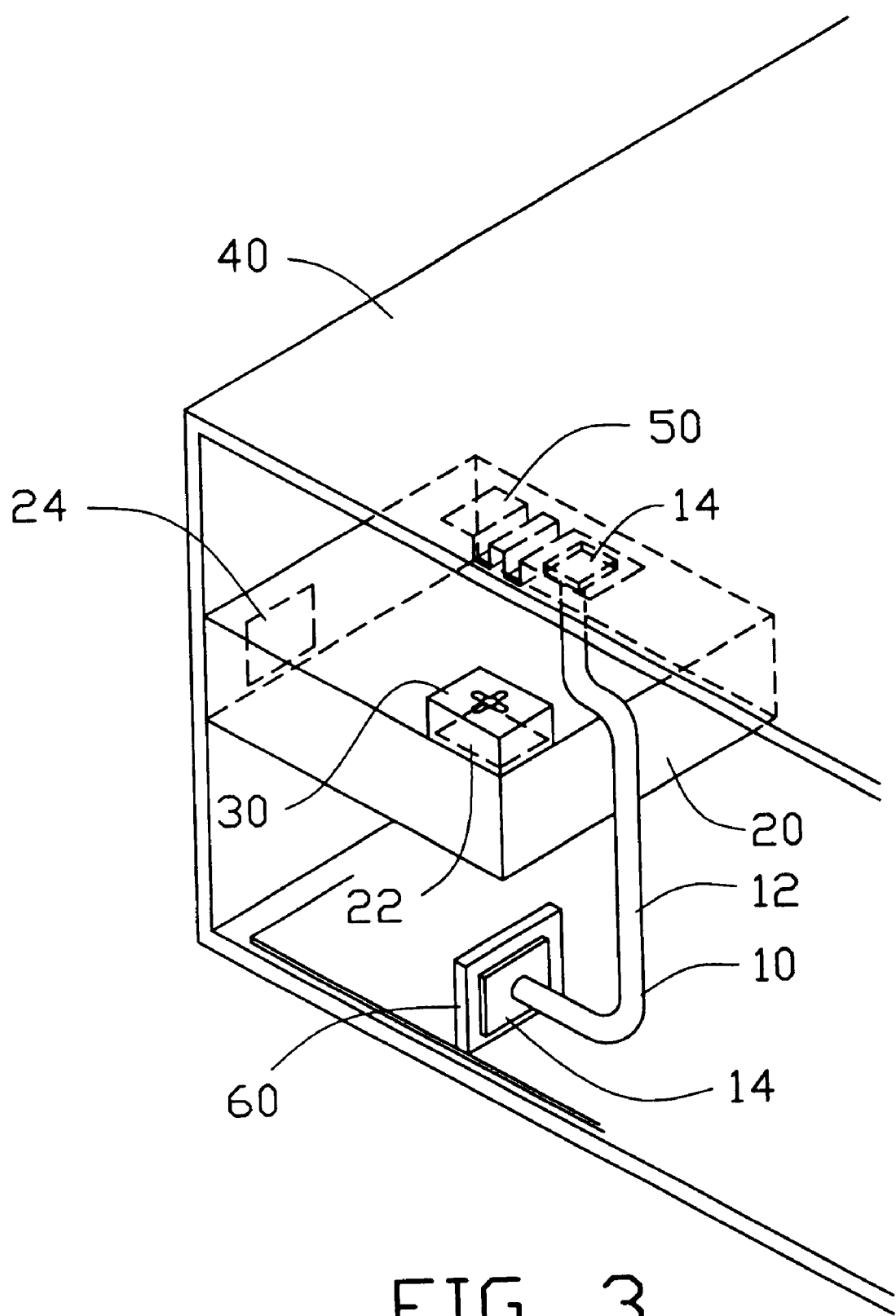
FIG. 3 is a perspective view of a third embodiment of a heat sink system.

Referring to FIG. 3, the heat sink system of a third embodiment of the present invention includes a heat pipe 10, a fan duct 20, a fan 30, a computer enclosure 40 and a folded fin 50. The fan duct 20 is a square hollow plastic shell having a side surface attached to the computer enclosure 40 forming an opening (not shown). The side surface of the fan duct 20 defines a first hole 24 in communication with the opening thereby communicating with an exterior of the computer enclosure 40. A second hole 22 is defined in a top surface in communication with an interior of the computer enclosure 40. The fan 30 is assembled in the second hole 22 for aspirating cold air from the exterior through the fan duct 20 and into the interior. The folded fin 50 bent from a metallic plate in the shape of a waveform is attached to the computer enclosure 40 facing the fan 30. The heat pipe 10 includes a main body 12 and two attaching portions 14 at opposite ends thereof. The two attaching portions 14 are attached to a heat generating element (such as a chip) and the folded fin 50, respectively. Liquid being in a liquid state at a nonoperating temperature, such as water, is disposed within the main body 12.

Thus, heat can be conducted from a heat generating element 60 toward the folded fin 50 and the computer enclosure 40 due to convection of the liquid and the liquid changing to a gaseous state. Cold air is aspirated from the first hole 24 through the fan duct 20 and toward the computer enclosure 40 whereby heat accumulated on the folded fin 50 having a large surface area and the computer enclosure 40 is dissipated. Furthermore, the computer enclosure 40 having a large surface area promotes quick dissipation of the heat to the exterior.

It is understood that the invention may be embodied in other specific forms without departing from the spirit of the central characteristics thereof. Thus, the present examples and embodiments are to be considered in all respects as illustrative and not restrictive, and the invention is not to be limited to the details given herein.

What is claimed is:

1. A heat sink system assembled within a computer enclosure for introducing ambient air through an opening of the computer enclosure to dissipate heat away from a heat generating element, comprising:
   a fan duct coupled to the computer enclosure near the opening, the fan duct having a first hole in communication with the opening and a second hole situated within an interior of the computer enclosure;
   a heat pipe attached and connected between the heat generating element and the computer enclosure and having one end portion opposing the second hole of the fan duct; and
   a fan being attached to the fan duct and overlaying the second hole of the fan duct to guide ambient air inflowing from the first hole through the second hole to directly cool the end portion of the heat pipe.

2. The heat sink system as described in claim 1, wherein the fan duct is a square hollow shell.

3. The heat sink system as described in claim 1, wherein the heat pipe includes a main body and two attaching portions at opposite ends thereof for being respectively attached to the heat generating element and a portion of the computer enclosure facing the second hole.

4. The heat sink system as described in claim 3, wherein conductive material is received in the main body of the heat pipe and is in a liquid state at a nonoperating temperature.

* * * * *